United States Patent
Kim et al.

(10) Patent No.: US 9,391,080 B1
(45) Date of Patent: Jul. 12, 2016

(54) MEMORY BIT CELL FOR REDUCED LAYOUT AREA

(71) Applicant: GLOBALFOUNDRIES Inc., Grand Cayman (KY)

(72) Inventors: Juhan Kim, Santa Clara, CA (US); Mahbub Rashed, Cupertino, CA (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/698,066

(22) Filed: Apr. 28, 2015

(51) Int. Cl.
  *H01L 27/11* (2006.01)
  *H01L 27/02* (2006.01)

(52) U.S. Cl.
  CPC ........ *H01L 27/1104* (2013.01); *H01L 27/0207* (2013.01)

(58) Field of Classification Search
  CPC ................ H01L 21/77; H01L 21/8283; H01L 21/823771; H01L 27/11; H01L 27/116
  USPC ......................................................... 438/152
  See application file for complete search history.

(56) References Cited

U.S. PATENT DOCUMENTS

| | | | |
|---|---|---|---|
| 6,271,063 B1 | 8/2001 | Chan et al. | |
| 6,737,685 B2 | 5/2004 | Aipperspach et al. | |
| 8,076,236 B2 | 12/2011 | Schultz et al. | |
| 8,823,178 B2 | 9/2014 | Kim et al. | |
| 8,934,287 B2 * | 1/2015 | Liaw | H01L 27/11 257/E21.661 |
| 9,006,841 B2 * | 4/2015 | Kumar | H01L 27/11 257/379 |
| 9,136,153 B2 * | 9/2015 | Or-Bach | H01L 21/823828 |
| 2002/0117722 A1 | 8/2002 | Osada et al. | |
| 2003/0123279 A1 | 7/2003 | Aipperspach et al. | |
| 2004/0196705 A1 | 10/2004 | Ishikura et al. | |
| 2006/0019488 A1 | 1/2006 | Liaw | |
| 2006/0121715 A1 | 6/2006 | Chang et al. | |
| 2008/0083991 A1 | 4/2008 | Yang et al. | |
| 2008/0192561 A1 | 8/2008 | Huang et al. | |
| 2009/0168498 A1 | 7/2009 | Pillarisetty et al. | |
| 2009/0187877 A1 | 7/2009 | Vickery, III | |
| 2011/0111330 A1 | 5/2011 | Schultz et al. | |
| 2011/0269275 A1 | 11/2011 | Yang et al. | |
| 2012/0108036 A1 | 5/2012 | Chang et al. | |
| 2014/0332967 A1 | 11/2014 | Kim et al. | |

\* cited by examiner

*Primary Examiner* — Cuong Q Nguyen
(74) *Attorney, Agent, or Firm* — Ditthavong & Steiner, P.C.

(57) ABSTRACT

An approach for providing SRAM bit cells with miniaturized bit cells, without local interconnection layers, with improved lithographic printability, and enabling methodology are disclosed. Embodiments include providing first color structures, in a M1 layer, including a first word line, a first bit line, a second bit line, a first ground line, a second ground line, a second latch line or a combination thereof, wherein the first color structures include side edges longer than tip edges; providing second color structures, in the M1 layer, including a second word line, a first power line, a second power line, a first latch line or a combination thereof, wherein the second color structures include side edges longer than tip edges; and forming a bit cell including the first color structures and the second color structures, wherein adjacent tip edges include a first color structure tip edge and a second color structure tip edge.

12 Claims, 10 Drawing Sheets

FIG. 1
Background

FIG. 2A
Background

FIG. 2B
Background

FIG. 3A
Background

FIG. 3B
Background

MEMORY BIT CELL FOR REDUCED LAYOUT AREA

TECHNICAL FIELD

The present disclosure relates to fabrication of miniaturized static random access memory (SRAM) bit cells. The present disclosure is particularly applicable to SRAM bit cells for 28 nanometer (nm) technology nodes and beyond.

BACKGROUND

As technology advances, and the dimensions of transistor devices continue to shrink, fabrication of semiconductors require more advanced manufacturing processes/equipment (fab) that may require additional investment by semiconductor manufacturers. For example, a fab producing 28 nm node devices would need to be updated for manufacturing devices in 20 or 14 nm nodes. Still, it would be advantageous for a semiconductor manufacturer to be able to produce smaller pitch devices without major investment in a current fab. A fab producing devices in 28 nm nodes may be utilized to produce devices, for example in 22 nm nodes, which can still offer benefits such as smaller and more efficient IC device.

Figure 1:
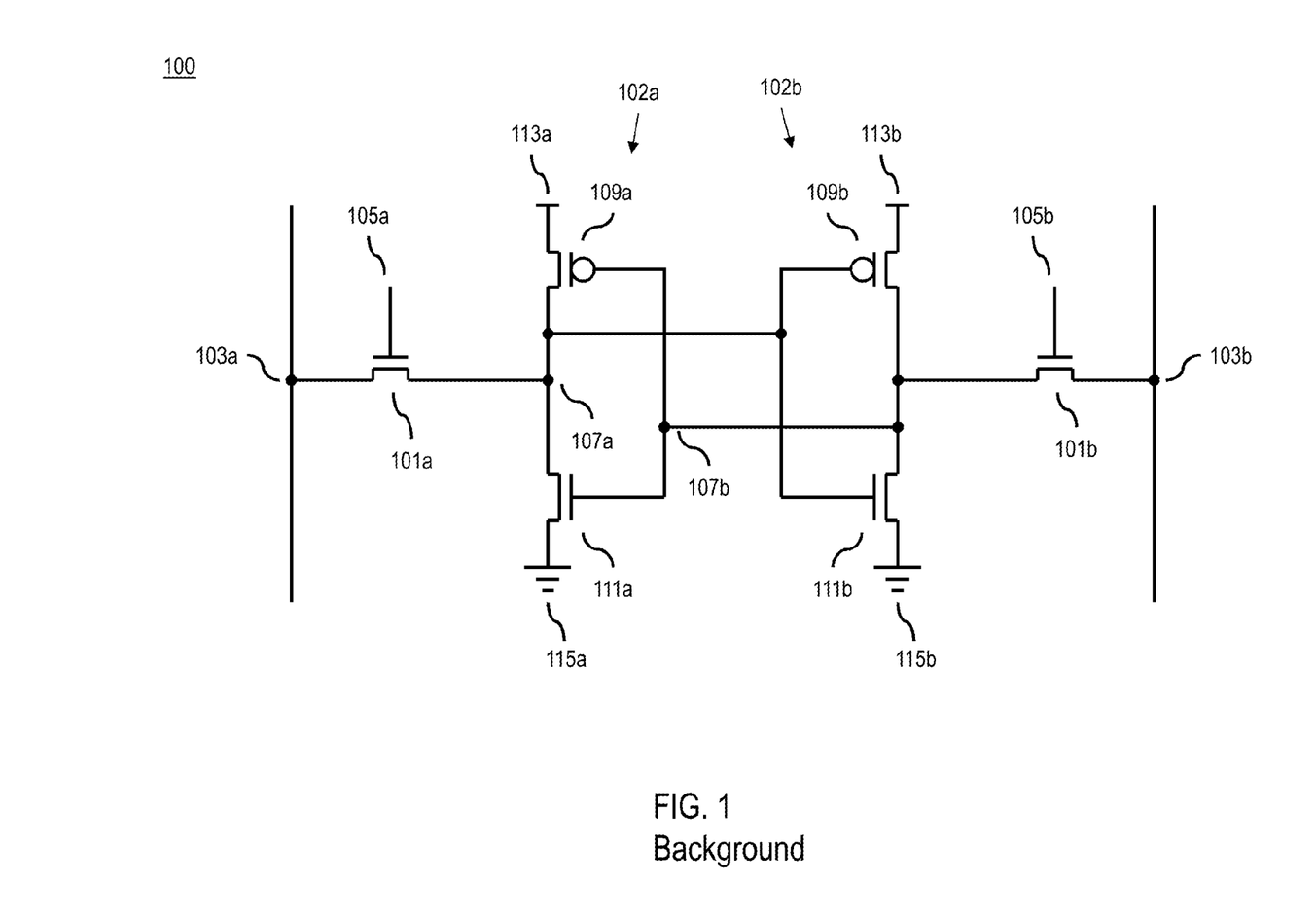
FIG. 1 schematically illustrates an example circuit diagram of a bit cell with double patterned metal layer structures.

FIG. 1 schematically illustrates an example circuit diagram of a bit cell with double patterned metal layer structures. As shown, bit cell 100 includes pass-gates 101a and 101b, inverters 102a and 102b, bit lines 103a and 103b, word lines 105a and 105b, and internal nodes 107a and 107b for configuring a latch with the two inverters that respectively include P-type metal-oxide-semiconductor (PMOS) 109a and PMOS 109b and n-type metal-oxide-semiconductor (NMOS) 111a and NMOS 111b. Each inverter is connected to its respective power line 113a or 113b, and ground line 115a or 115b. The internal node 107a is connected to the pass-gate 101a which is controlled by the word line 105a, and the internal node 107b is connected to the pass-gate 101b which is controlled by the word line 105b.

One of the challenges in implementing smaller node technologies is in the area of lithography processes, which are utilized to print/pattern various layers of a circuit design onto a surface of a silicon (Si) substrate for creating devices (e.g., transistors) and circuits to form an IC device. Patterning smaller technology nodes in compact areas of an IC device can be difficult and time consuming. In some instances, a single patterning lithography process may be incompatible for defining a compact layer such as a metal1 (M1) layer in a memory bit cell, where the M1 layer may be limited to be printed on a Si substrate below metal pitch 90 nm including a line width of 45 nm and spacing of 45 nm.

Figure 2A:
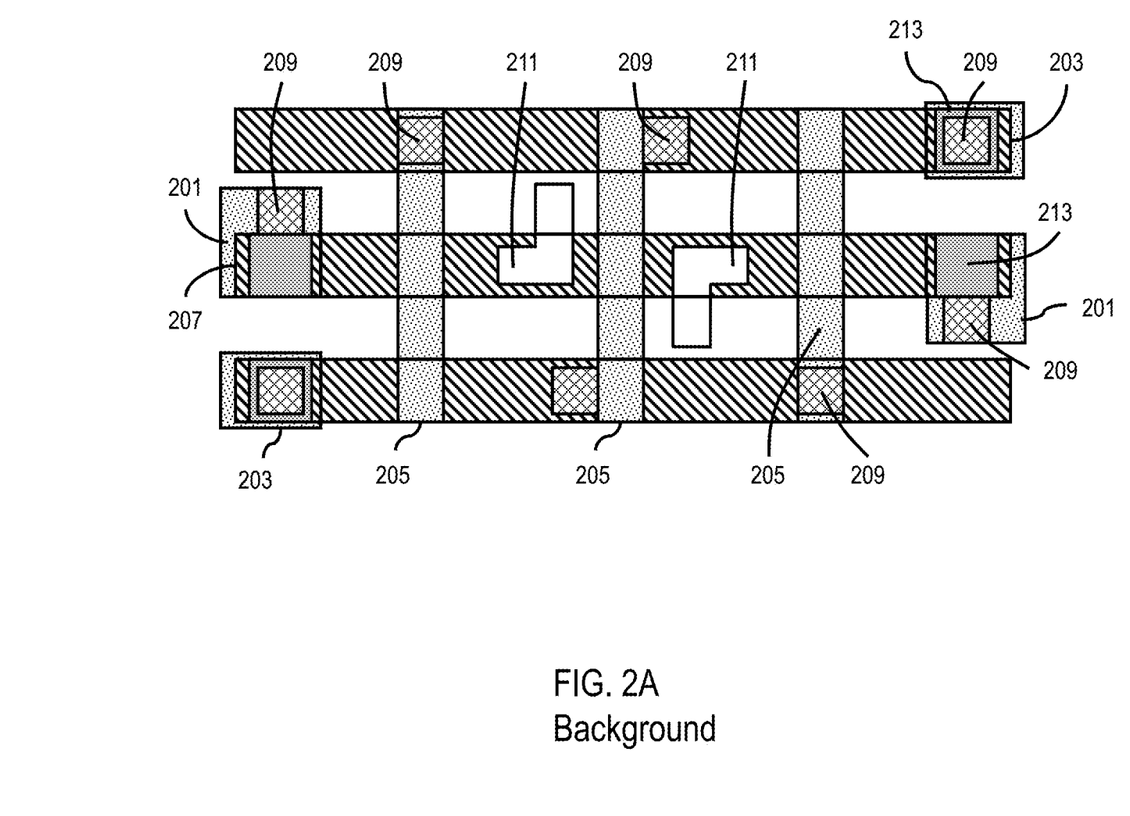
FIGS. 2A and 2B illustrate example layout diagrams of SRAM bit cells with single patterned metal layer structures.

FIG. 2A illustrates an example layout diagram of a SRAM cell with single patterned metal layer structures. In this example, the layout is for a typical SRAM memory cell that includes M1 word line structure as landing pads 201, M1 ground line structure as landing pads 203, M1 bit line structure 205, and metal2 (M2) layer structure 207. In addition, the layout includes active region contacts 209, metal contacts 211, and vial structures 213 to provide various interconnections for the M1 layer structures 201, 203, and 205, and the M2 layer structure 207. However, this layout may be difficult to print onto a substrate as the metal structures may be too close to each other to be printed by the same patterning process. As shown, for instance, word line landing pads 201 may be too close to ground line landing pads 203, and landing pads 201 and 203 may be too close to bit line structure 205. As such, it may become increasingly difficult to further shrink the design of the memory cell.

Figure 2B:
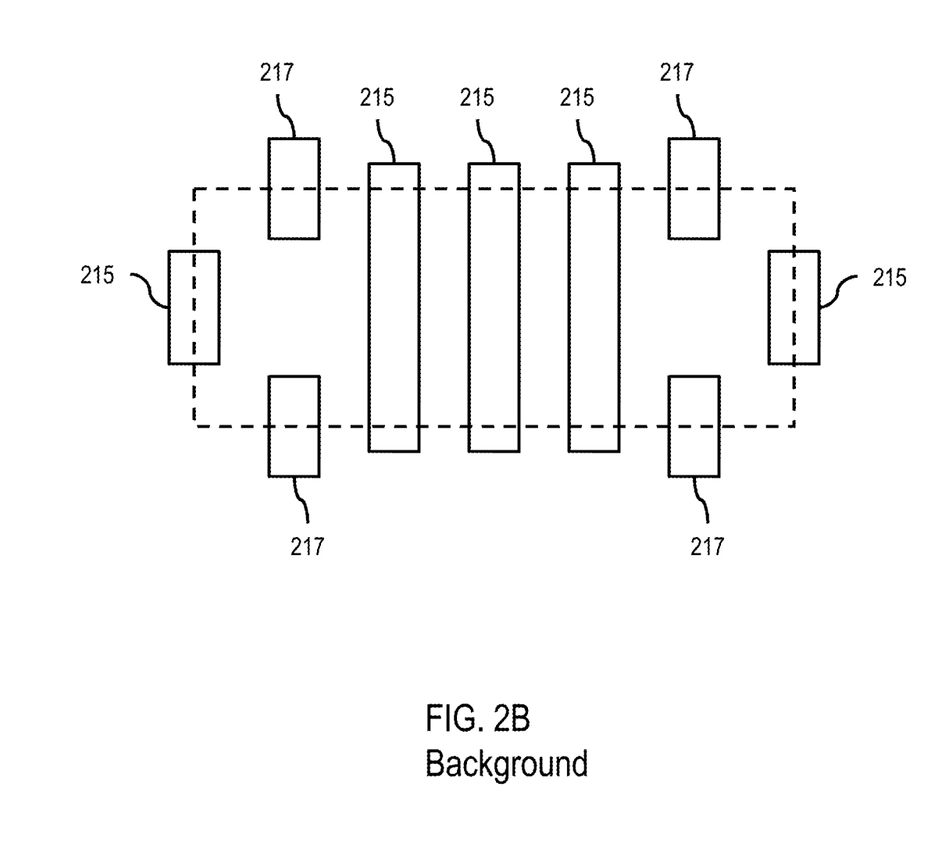

Illustrated in FIG. 2B is another example of a memory cell layout including single patterned metal lines (e.g., M1 layer structures 215 and 217) that could occupy a significant space in an IC device. However, if the height of the memory cell is reduced (e.g., to decrease the space occupied), the tip-to-tip spacing between the M1 layer structures 217 (in which the tip is narrower side of the structure), particularly when patterned by a single patterning process, will become too close, negatively affecting lithographic printability and reliability. However, a more advanced lithographic process of double patterning may address some of the challenges as discussed.

Figure 3A:
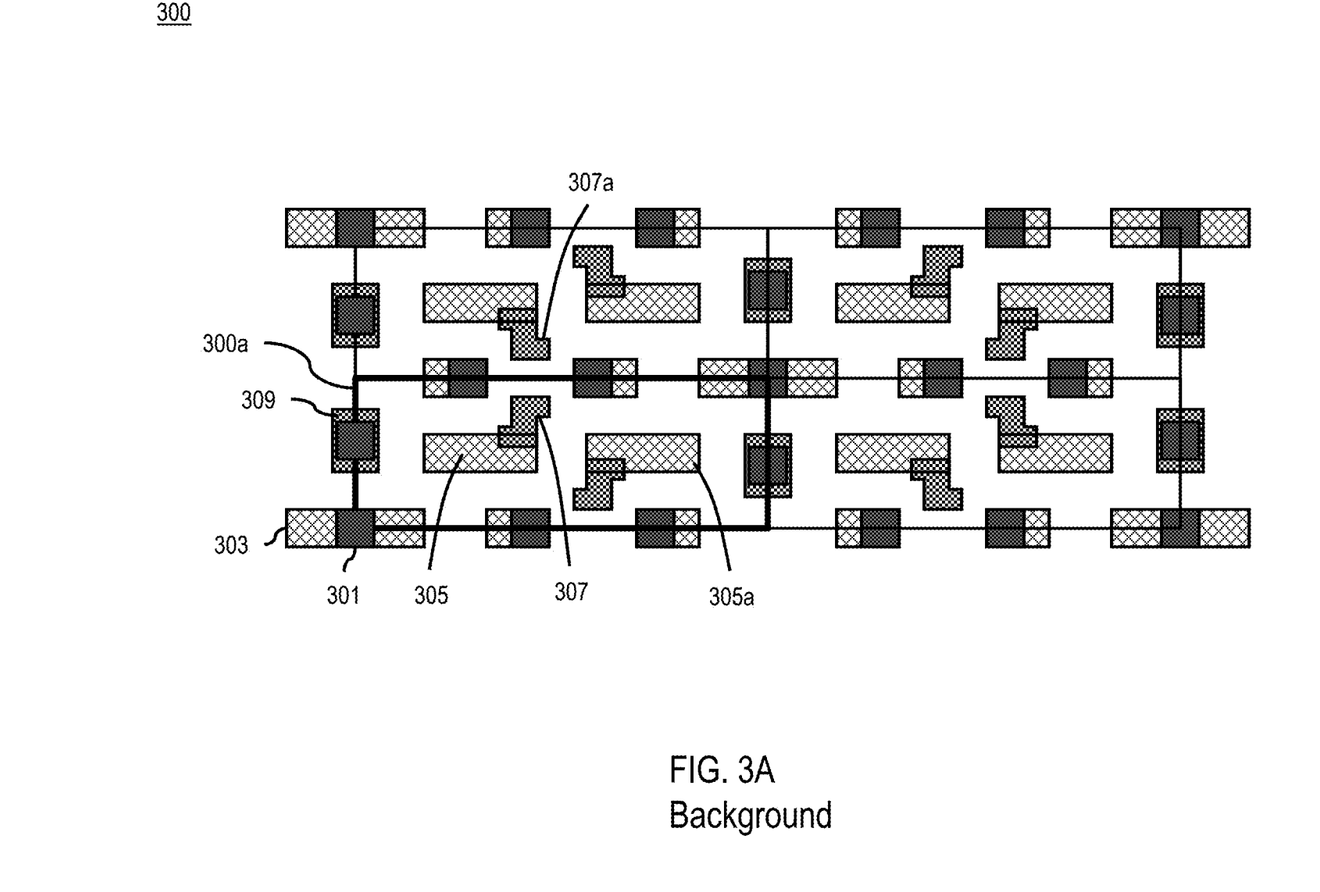
FIGS. 3A and 3B illustrate example layout diagrams of a bit cell utilizing a double patterning lithography process.
Figure 3B:
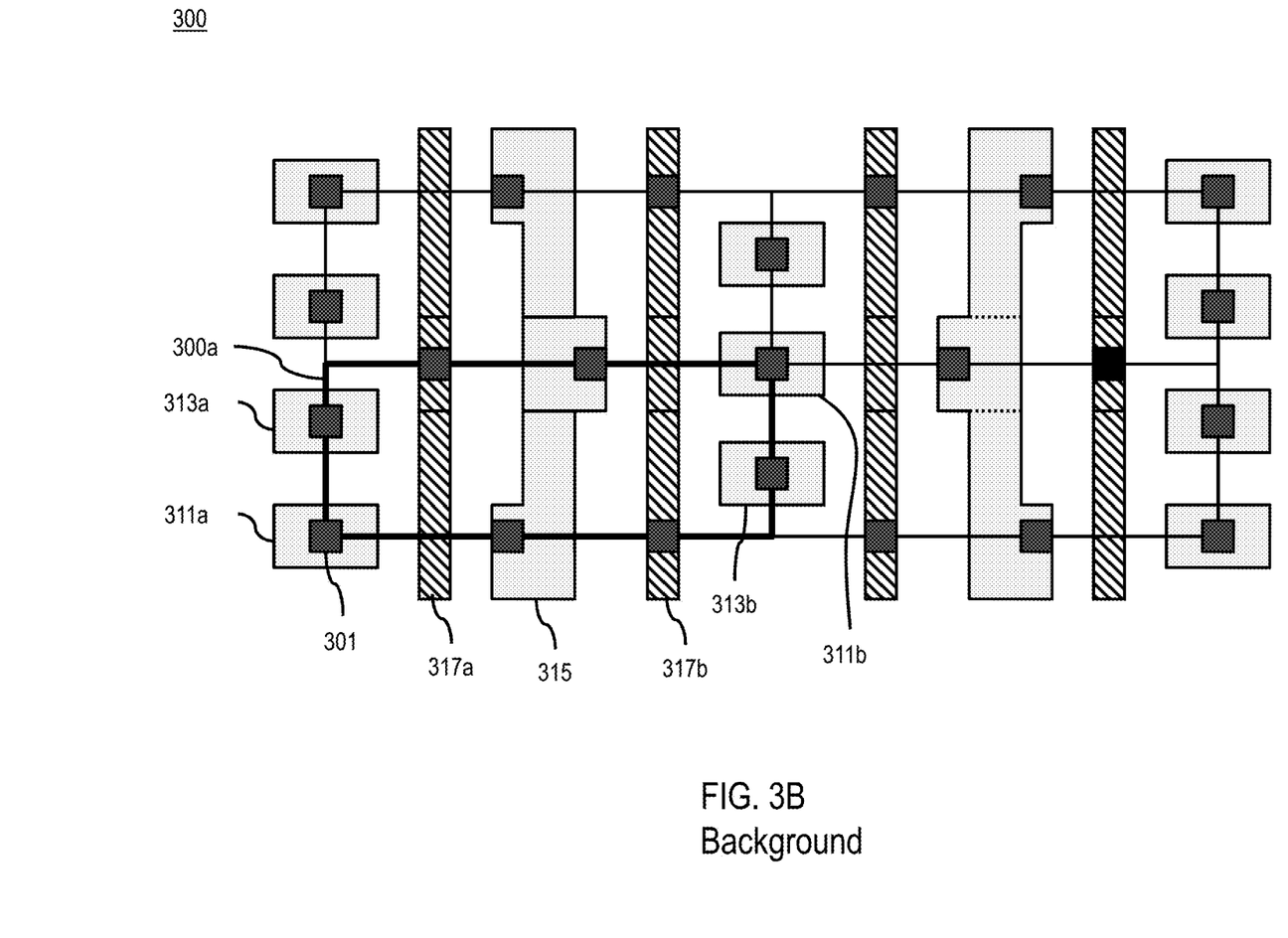

FIGS. 3A and 3B illustrate example layout diagrams of a memory cell utilizing a double patterning lithography process. In double patterning, litho-etch-litho-etch, litho-freeze-litho-etch, self-aligned-double-patterning, or the like processes may be utilized.

FIG. 3A illustrates local interconnection layers and via0 structures. A memory cell 300 (e.g., one of the memory cells in a 2-by-2 array) includes via0 structures 301 for connecting metal layer structures to active region contacts (not shown for illustrative convenience). Local interconnection layer (or active contact region) 303 is connected to via0 contact region 301, and another local interconnection layer 305 for connecting internal nodes with poly contact region 307, which is connected to poly gate region (not shown for illustrative convenience). Another poly contact region 309 is shown to contact to a poly gate for word line (not shown for illustrative convenience). These local interconnection layers allow flexibility in placement of via0 contacts for connecting to the M1 layer. With local interconnection layers, an active contact layer is single patterned, so that internal nodes are positioned as tip-to-tip, e.g., the active contact region 305 and another active region 305a. Also, a poly contact region is single patterned such that the poly contact region 307 is positioned tip-to-tip with adjacent poly contact region 307a in a next cell.

FIG. 3B illustrates M1 layer structures and vial structures associated with FIG. 3A. As shown in FIG. 3B, local interconnection layers are not directly connected to M1 layer, so that there is flexibility in forming the shape of the M1 layers for contact with the via0 structures 301. M1 layer structures of the cell 300 in FIG. 3A include M1 ground line structures 311a and 311b, M1 word line structures 313a and 313b, M1 power line structure 315, and M1 bit line structures 317a and 317b. In a double patterning process, bit line structures 317a and 317b are by a first patterning process and the other structures are by a second patterning process. With local interconnect layers 303 and 309 in FIG. 3A, a repeating array may be configured without complexity since the cell in FIG. 3B includes symmetrical metal layers.

In more advanced technology nodes (e.g., 20 nm and below), middle of lines are used for connecting nodes as local interconnections. A local interconnection layer may be added under a via0 layer, which may be formed under M1 layer. However, local interconnection layers require additional mask layers, which would increase manufacturing cost and time.

Therefore, a need exists for a miniaturized bit cell, without local interconnection layers, with improved lithographic printability, and enabling methodology.

SUMMARY

An aspect of the present disclosure is a method for implementing a miniaturized bit cell, without local interconnection layers and with improved lithographic printability.

Another aspect of the present disclosure is a device implemented with miniaturized bit cell, without local interconnection layers.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including providing first color structures, in a M1 layer, including a first word line, a first bit line, a second bit line, a first ground line, a second ground line, a second latch line or a combination thereof, wherein the first color structures include side edges longer than tip edges; providing second color structures, in the M1 layer, including a second word line, a first power line, a second power line, a first latch line or a combination thereof, wherein the second color structures include side edges longer than tip edges; forming a bit cell including the first color structures and the second color structures, wherein adjacent tip edges include a first color structure tip edge and a second color structure tip edge; and forming an array of four bit cells including a first bit cell at a lower left position, a second bit cell at a lower right position, a third bit cell at an upper left position, and a fourth bit cell at an upper right position, wherein a layout of the second bit cell is a mirror image of a layout of the first bit cell, a layout of the third bit cell is same as the layout of the second bit cell, and a layout of the fourth bit cell is same as the layout of the first bit cell.

Another aspect includes providing the first color structures by forming them concurrently by a first patterning process. One aspect includes providing the second color structures by forming them concurrently by a second patterning process.

Some aspects include providing a first tip edge of the first ground line adjacent to a first tip edge of the first power line; providing a first tip edge of the first latch line adjacent to a first tip edge of the second latch line; and providing a first tip edge of the second ground line adjacent to a first tip edge of the second power line.

Other aspects include providing a second tip edge of the first power line opposing a first tip edge of the second bit line; providing a second tip edge of the first latch line adjacent to a first side edge of the first word line; providing a second tip edge of the second latch line adjacent to a first side edge of the second word line; providing a first tip edge of the second word line adjacent to a first side edge of the second ground line; and providing a second tip edge of the second power line opposing a first tip edge of the first bit line.

Certain aspects include forming the first ground line, first power line, and second bit line tip to tip along a first edge of the bit cell; forming the first bit line, second power line, and second ground line tip to tip along a second edge of the bit cell opposite the first edge; and forming the first and second latch lines tip to tip between the first and second edges of the bit cell.

In some aspects, a space between a first color structure tip edge or side edge and a second color structure tip edge or side edge is less than a space between two tip edges, two side edges, or a tip edge and a side edge of a same color structure. In one aspect, the space between the first color structure tip edge adjacent to the second color structure tip edge is less than the space between two adjacent tip edges of the same color structure.

Another aspect includes providing the first word line for sharing by the first bit cell and the second bit cell; and providing another second word line for sharing by the third bit cell and the fourth bit cell, wherein a second tip edge of the first word line is adjacent to a first tip edge of another second word line. One aspect includes providing contacts to directly connect the first color structures and the second color structures to a gate structure or active regions.

Another aspect of the present disclosure includes a memory device including first color structures, in a M1 layer, including a first word line, a first bit line, a second bit line, a first ground line, a second ground line, a second latch line or a combination thereof, wherein the first color structures include side edges longer than tip edges; second color structures, in the M1 layer, including a second word line, a first power line, a second power line, a first latch line or a combination thereof, wherein the second structures include side edges longer than tip edges; a bit cell including the first color structures and the second color structures, wherein adjacent tip edges include a first color structure tip edge and a second color structure tip edge; and an array of four bit cells including a first bit cell at a lower left position, a second bit cell at a lower right position, a third bit cell at an upper left position, and a fourth bit cell at an upper right position, wherein a layout of the second bit cell is a mirror image of a layout of the first bit cell, a layout of the third bit cell is same as the layout of the second bit cell, and a layout of the fourth bit cell is same as the layout of the first bit cell.

In some aspects of the memory device, the bit cell includes a first tip edge of the first ground line adjacent to a first tip edge of the first power line; a first tip edge of the first latch line adjacent to a first tip edge of the second latch line; and a first tip edge of the second ground line adjacent to a first tip edge of the second power line.

In some aspects of the memory device, the bit cell includes a second tip edge of the first power line opposing a first tip edge of the second bit line; a second tip edge of the first latch line adjacent to a first side edge of the first word line; a second tip edge of the second latch line adjacent to a first side edge of the second word line; a first tip edge of the second word line adjacent to a first side edge of the second ground line; and a second tip edge of the second power line opposing a first tip edge of the first bit line.

In another aspect of the memory device, the bit cell includes the first ground line, first power line, and second bit line arranged tip to tip along a first edge of the bit cell; the first bit line, second power line, and second ground line arranged tip to tip along a second edge of the bit cell opposite the first edge; and the first and second latch lines arranged tip to tip between the first and second edges of the bit cell.

In some aspects of the device, a space between a first color structure tip edge or a side edge and a second color structure tip edge or a side edge is less than a space between two tip edges, two side edges, or a tip edge and a side edge of a same color structure. In one aspect of the device, the space between the first color structure tip edge adjacent to the second color structure tip edge is less than the space between two adjacent tip edges of the same color structure.

In another aspect of the memory device, the first word line is shared by the first bit cell and the second bit cell; and another second word line is shared by the third bit cell and the fourth bit cell, wherein a second tip edge of the first word line is adjacent to a first tip edge of another second word line. Some aspects of the memory device include contacts directly connecting the first color structures and the second color structures to a gate structure or active regions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of lithographic difficulties attendant upon fabrication of compact bit cells without having local interconnection layers. The present disclosure addresses and solves such problems, for instance, by, inter alfa, utilizing double patterning processes to create M1 layer structures that are asymmetrically colored with a layout to avoid same color tip to tip space for efficient and reliable printing of the M1 layer patterns on the silicon wafer for manufacturability.

Figure 4:
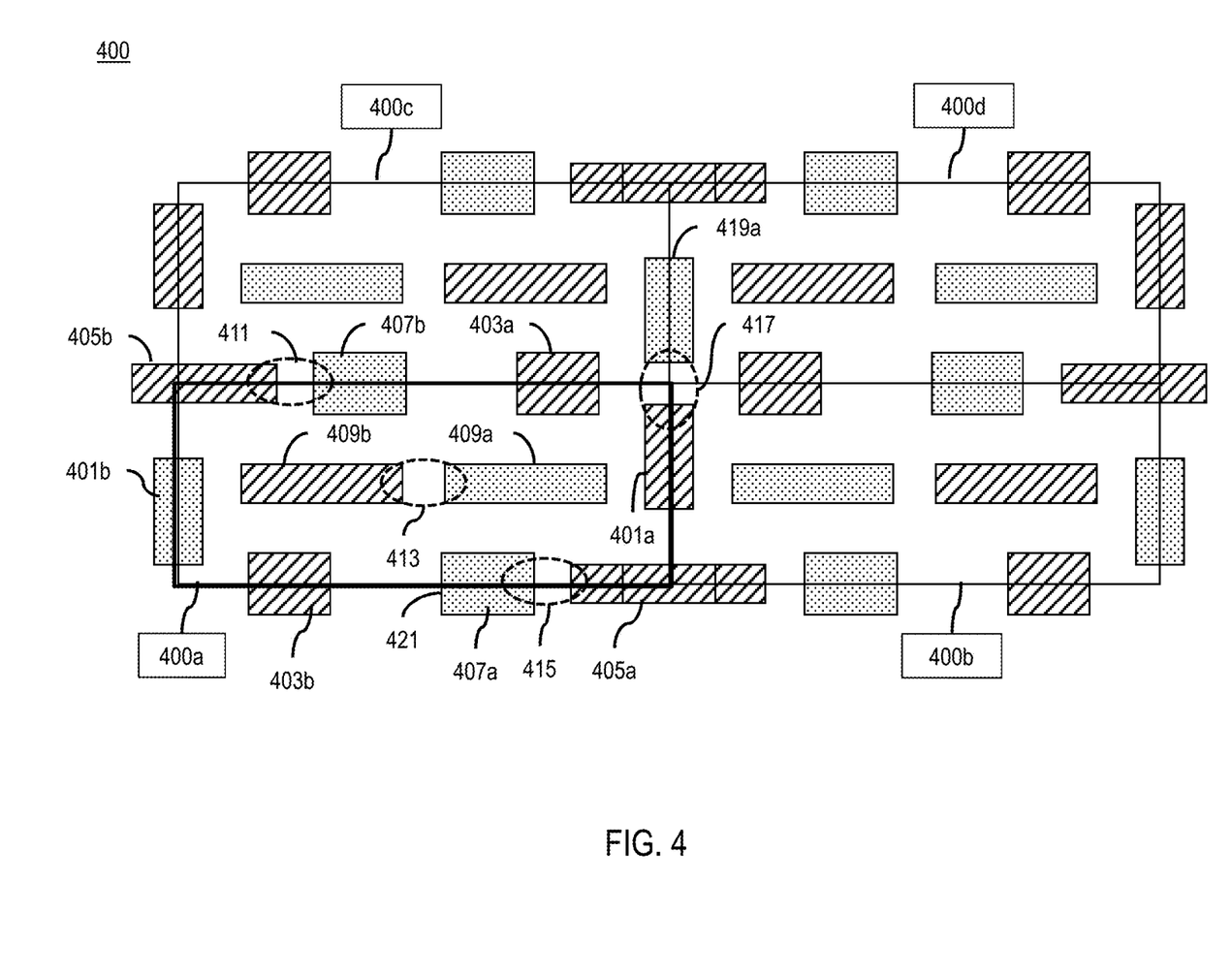
FIG. 4 illustrates an array and layout of bit cells having double patterned metal layer structures without local interconnection layers, in accordance with an exemplary embodiment of the present disclosure.

FIG. 4 illustrates a layout diagram of an array of bit cells having double patterned metal layer structures without local interconnection layers, in accordance with an exemplary embodiment of the present disclosure.

In this example, array 400 includes four bit cells 400a, 400b, 400c, and 400d to form a 2×2 SRAM. Larger arrays may be formed by integrating smaller repeating arrays. The bit cells are identical and are formed by use of double patterned metal layer structures including first structures (e.g., first color) and second structures (e.g., second color) in a M1 layer. However, as will be discussed further, layout of some of the bit cells in the array are flipped with reference to the other bit cells in the array. Adverting to bit cell 400a, the cell includes M1 layer structures such as word lines 401a and 401b, bit lines 403a and 403b, ground lines 405a and 405b, power lines 407a and 407b, and latch lines 409a and 409b. The M1 layer structures are in rectangular shapes that include tip edges and side edges, where a side edge is longer than a tip edge. The word line 401a, bit lines 403a and 403b, ground lines 405a and 405b, and the latch line 409b are created by use of a first patterning, known as a first color, process. Further, the word line 401b, power lines 407a and 407b, and the latch line 409a are created by a second patterning, or a second color, process. As illustrated, in the layout of the bit cell, two adjacent tip edges include a first structure tip edge and a second structure tip edge. For example, the tip edges indicated in areas 411, 413, 415, and 417 each include one tip edge of first color structures (e.g., by a first patterning) that is adjacent to a tip edge of a second color structure (e.g., by a second patterning). Namely, in 411, a tip edge of 405b is adjacent to a tip edge of 407b; in 413, a tip edge of 409b is adjacent to a tip edge of 409a; in 415, a tip edge of 407a is adjacent to a tip edge of 405a; and in 417, a tip edge of 401a is adjacent to a tip edge of 419a.

As shown, the first and second structures (e.g., first and second colors) of the M1 layer are positioned asymmetrically in order to avoid same structure tip-to-tip placement for improving reliability of the printing/patterning processes of the M1 layer patterns onto the Si substrate, which would improve manufacturability of compact bit cells in an IC device. If same type/color structures (e.g., first or second) are positioned tip-to-tip, then more space between the tips would be necessary to reliably print the structures. In general, in the example layout for bit cell 400a, most of spacing rules are slightly tighter than those in a standard cell layout.

Also, as illustrated, adjacent to the bit cell 400a is the bit cell 400b, the layout of which is a horizontally flipped version of the layout of bit cell 400a. Additionally, the bit cells 400a and 400b share the word line 401a.

Similarly, the bit cells 400c and 400d share a word line 419a. Also, the word line 401a and the word line 419a are of different structures (e.g., by different patterning processes) and are positioned in a tip-to-tip formation, as shown in 417. The layout of bit cell 400c is the same as the layout of 400b, and the layout of the bit cell 400d is the same as the layout of the bit cell 400a.

As an alternative configuration, for realizing a compact bit cell layout, a wide tip edge may also be used to reduce the space requirement between the tip edge of one rectangular element and a side edge of another. For example, the tip edge of the power line 407a is wider than 60 nm, which allows the tip edge of power line 407a to be treated as a side edge, where a minimum space between a same color tip edge and a same color side edge may be 56 nm. As shown, width 421 of the tip edge of the power line 407a is wider than 60 nm, such that it can allow configuration of same color tip to side shape between the power line 407a and the first ground line 405a. Table 1 includes example measurements associated with configuration of different structures in a bit cell.

TABLE 1

| Structures | Space between 2 Structures |
|---|---|
| Same color tip to tip | 70 nm |
| Different color tip to tip | 40 nm |
| Same color tip to side | 56 nm |
| Different color tip to side | 40 nm |
| Same color side to side | 50 nm |
| Different color side to side | 40 nm |

Figure 5:
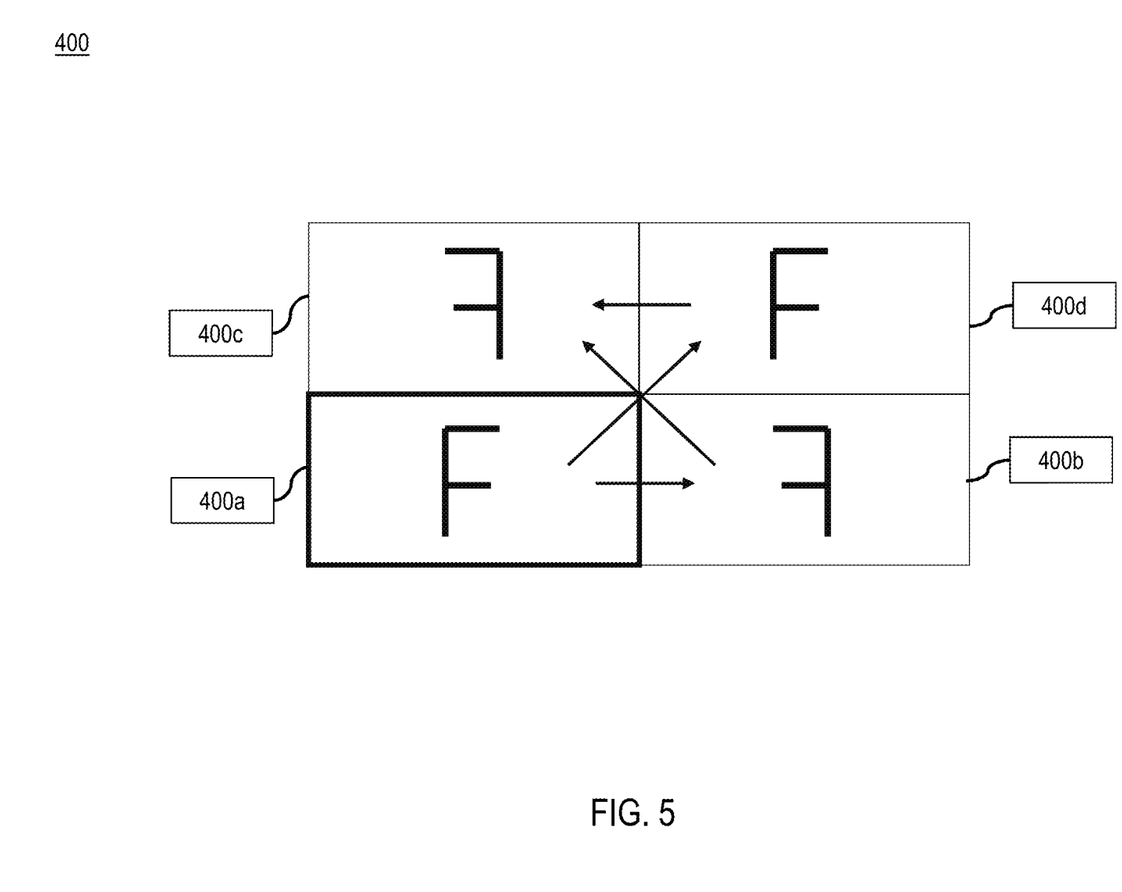
FIG. 5 illustrates configuration of bit cells in an array, in accordance with an exemplary embodiment of the present disclosure.

FIG. 5 illustrates configuration of bit cells in an array, in accordance with an exemplary embodiment of the present disclosure, where a figure "F" is utilized to illustrate the relationship among the layouts of the bit cells of FIG. 4. As shown in the array 400 of FIG. 5, bit cell 400a is at the lower left corner, bit cell 400b is at the lower right corner and has a layout that is horizontally flipped compared to the layout of the bit cell 400a. The bit cell 400c is at the upper left corner with a same layout as 400b, and the bit cell 400d is at the upper right corner with a same layout as 400a, or a horizontally flipped layout version of the bit cell 400c.

Figure 6:
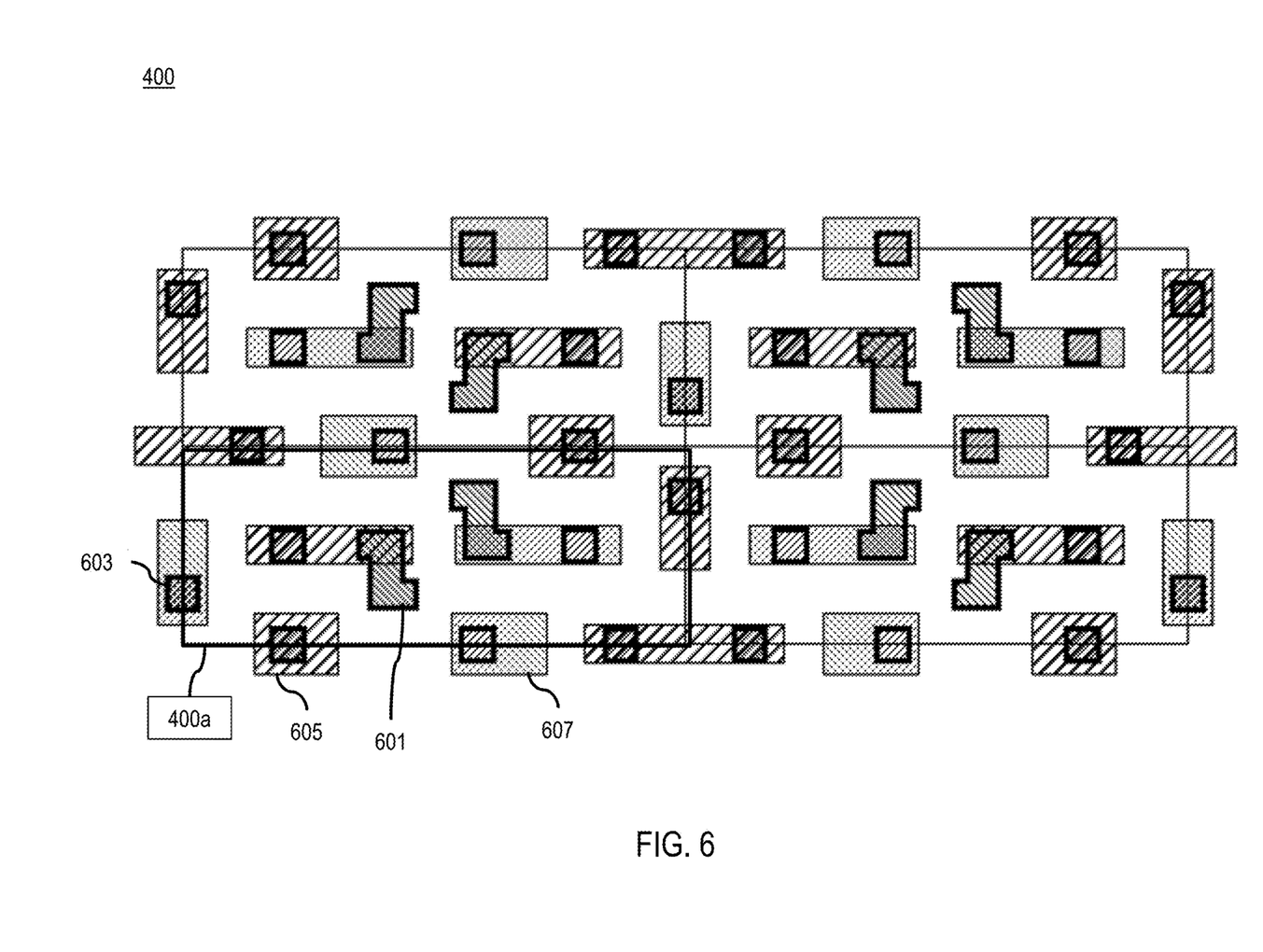
FIG. 6 illustrates connectivity between M1 layer structures, in accordance with an exemplary embodiment of the present disclosure.

FIG. 6 illustrates connectivity between M1 layer structures, in accordance with an exemplary embodiment of the present disclosure. As shown, in the bit cell 400a polygon contact layer 601 and square contact layer 603 may be utilized to connect to M1 layer first color 605, and second color 607 structures, respectively. Also, M2 layer structures (not shown for illustrative convenience) may be connected to the M1 layer structures 605 and 607 through vial layers (not shown for illustrative convenience).

Figure 7:
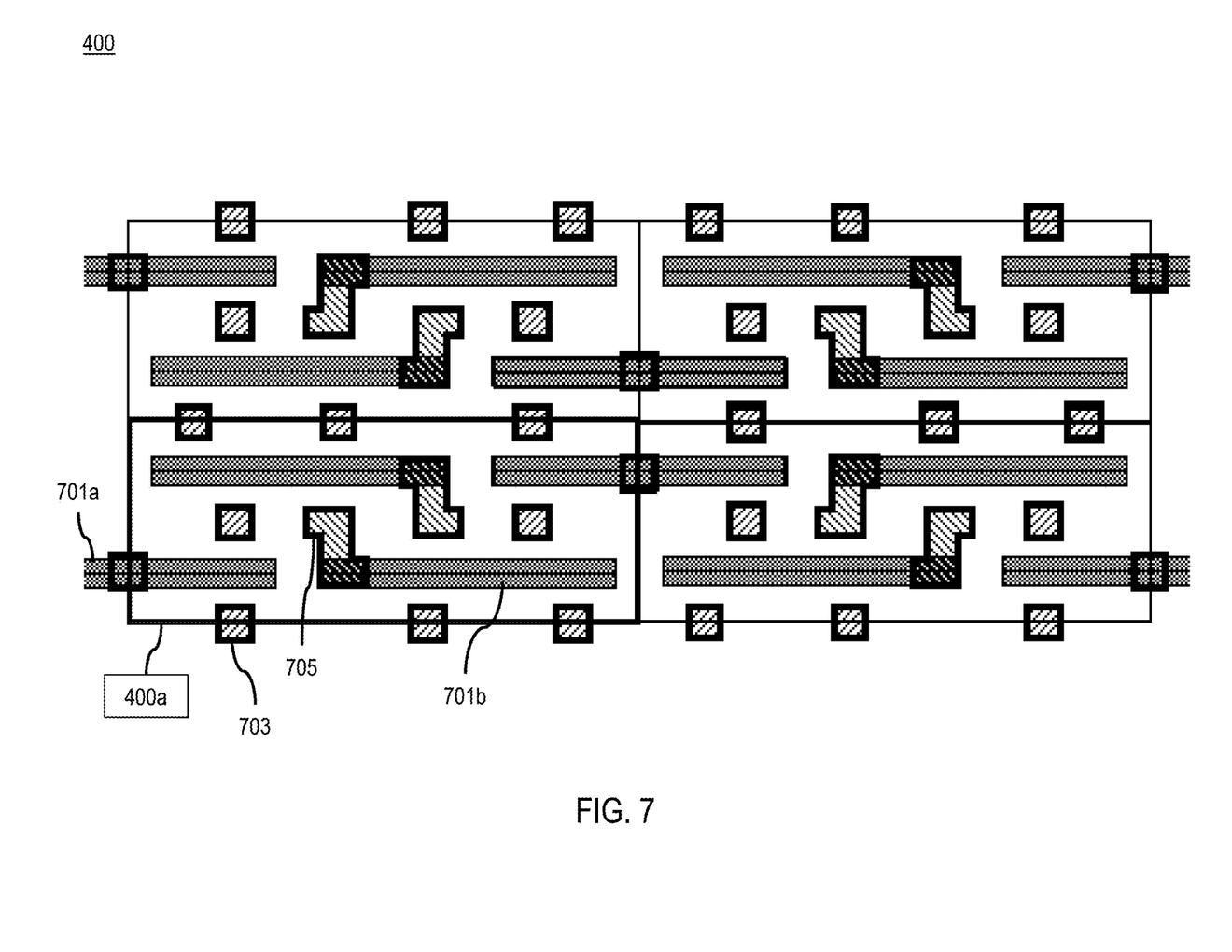
FIG. 7 illustrates base layers of a bit cell, in accordance with an exemplary embodiment of the present disclosure.

FIG. 7 illustrates base layers of a bit cell, in accordance with an exemplary embodiment of the present disclosure. As illustrated, the bit cell 400a may include poly structures 701a and 701b for forming transistor gates, which may be connected to the contact layers including square contact 703 and polygon contact 705.

Figure 8:
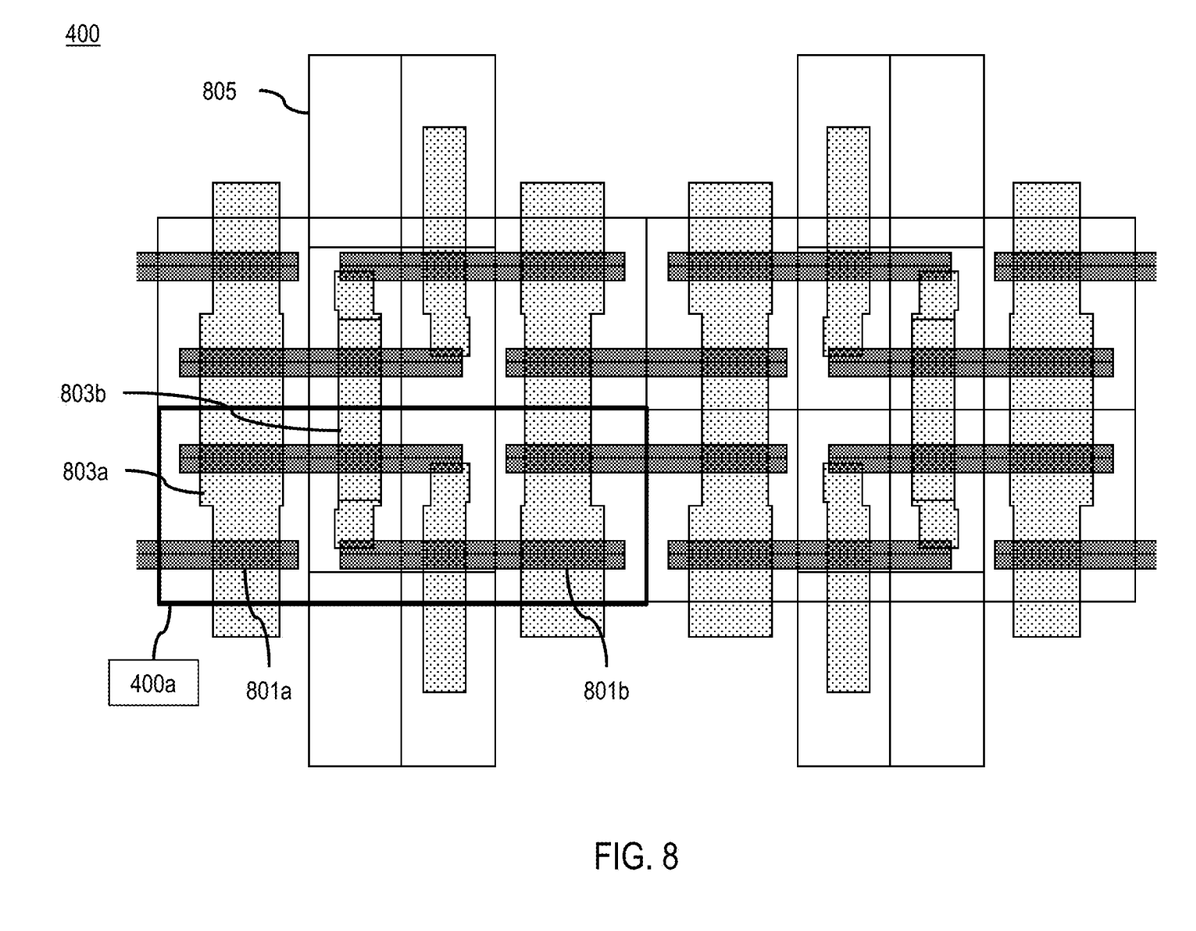
FIG. 8 illustrates poly structures and poly-cut regions associated with a bit cell having doubled patterned metal layer structures, in accordance with an exemplary embodiment of the present disclosure.

FIG. 8 illustrates poly structures and poly-cut regions associated with a bit cell having doubled patterned metal layer structures, in accordance with an exemplary embodiment of the present disclosure. Poly structures 801a and 801b may be formed on n-active regions 803a outside an n-well region 805 and p-active regions 803b inside the n-well region 805. The contact layers may be formed on the poly layer 801a and 801b, n-active region 803a and p-active region 803b. A transistor may be formed with poly gate 801a and n-active region 803a as source/drain regions, and various transistors may be formed in n-active region 803a and p-active region 803b. Transistors may be formed on silicon-on-insulator (SOI) in order to enhance performance as conventional planar transistors may be unable to achieve high performance with scaled geometries. Further, fully depleted silicon on insulator (FD-SOI) may be used for achieving 22 nm technology nodes and beyond.

As discussed, a bit cell designed with different M1 structures, patterned by different lithographic processes (e.g., different colors), may be asymmetrically configured in order to avoid same color conflicts. For example, the structures may be configured without having same color tip to tip adjacent to each other. Such a configuration/layout can enable reducing space between adjacent tip to tip structures while improving printability in lithography, since the same color tip to tip structures require larger separation. Additionally, an array of repeating bit cells may be designed by including flipped versions of layout of the bit cells. Furthermore, the proposed bit cell design is compatible with conventional bit cell structures, such as 28 nm bit cells, which may be fabricated by use of typical processes, and in existing fabrication facilities, with minimum investment.

The embodiments of the present disclosure can achieve several technical effects, including reduced bit cell size, improved lithographic printability associated with device fabrication, etc. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly in 28 nm technologies nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing first color structures, in a metal1 (M1) layer, including a first word line, a first bit line, a second bit line, a first ground line, a second ground line, a second latch line or a combination thereof, wherein the first color structures include side edges longer than tip edges;
   providing second color structures, in the M1 layer, including a second word line, a first power line, a second power line, a first latch line or a combination thereof, wherein the second color structures include side edges longer than tip edges;
   forming a bit cell including the first color structures and the second color structures, wherein adjacent tip edges include a first color structure tip edge and a second color structure tip edge; and
   forming an array of four bit cells including a first bit cell at a lower left position, a second bit cell at a lower right position, a third bit cell at an upper left position, and a fourth bit cell at an upper right position, wherein a layout of the second bit cell is a mirror image of a layout of the first bit cell, a layout of the third bit cell is same as the layout of the second bit cell, and a layout of the fourth bit cell is same as the layout of the first bit cell.

2. The method according to claim 1, further comprising:
   providing the first color structures by forming them concurrently by a first patterning process.

3. The method according to claim 2, further comprising:
   providing the second color structures by forming them concurrently by a second patterning process.

4. The method according to claim 1, wherein forming the bit cell comprises:
   providing a first tip edge of the first ground line adjacent to a first tip edge of the first power line;
   providing a first tip edge of the first latch line adjacent to a first tip edge of the second latch line; and
   providing a first tip edge of the second ground line adjacent to a first tip edge of the second power line.

5. The method according to claim 4, wherein forming the bit cell further comprises:

providing a second tip edge of the first power line opposing a first tip edge of the second bit line;

providing a second tip edge of the first latch line adjacent to a first side edge of the first word line;

providing a second tip edge of the second latch line adjacent to a first side edge of the second word line;

providing a first tip edge of the second word line adjacent to a first side edge of the second ground line; and providing a second tip edge of the second power line opposing a first tip edge of the first bit line.

6. The method according to claim 5, wherein forming the bit cell further comprises:

forming the first ground line, first power line, and second bit line tip to tip along a first edge of the bit cell;

forming the first bit line, second power line, and second ground line tip to tip along a second edge of the bit cell opposite the first edge; and forming the first and second latch lines tip to tip between the first and second edges of the bit cell.

7. The method according to claim 1, wherein a space between a first color structure tip edge or side edge and a second color structure tip edge or side edge is less than a space between two tip edges, two side edges, or a tip edge and a side edge of a same color structure.

8. The method according to claim 7, wherein the space between the first color structure tip edge adjacent to the second color structure tip edge is less than the space between two adjacent tip edges of the same color structure.

9. The method according to claim 1, further comprising:

providing the first word line for sharing by the first bit cell and the second bit cell; and providing another second word line for sharing by the third bit cell and the fourth bit cell, wherein a second tip edge of the first word line is adjacent to a first tip edge of another second word line.

10. The method according to claim 1, further comprising:

providing contacts to directly connect the first color structures and the second color structures to a gate structure or active regions.

11. A method comprising:

providing first color structures, in a metal1 (M1) layer, including a first word line, a first bit line, a second bit line, a first ground line, a second ground line, a second latch line or a combination thereof, wherein the first color structures include side edges longer than tip edges;

providing second color structures, in the M1 layer, including a second word line, a first power line, a second power line, a first latch line or a combination thereof, wherein the second color structures include side edges longer than tip edges;

forming a bit cell including the first color structures and the second color structures, wherein adjacent tip edges include a first color structure tip edge and a second color structure tip edge, and wherein a space between the first color structure tip edge adjacent to the second color structure tip edge is less than a space between two adjacent tip edges of a same color structure; and forming an array of four bit cells including a first bit cell at a lower left position, a second bit cell at a lower right position, a third bit cell at an upper left position, and a fourth bit cell at an upper right position, wherein a layout of the second bit cell is a mirror image of a layout of the first bit cell, a layout of the third bit cell is same as the layout of the second bit cell, and a layout of the fourth bit cell is same as the layout of the first bit cell.

12. The method according to claim 11, wherein forming the bit cell comprises:

providing a first tip edge of the first ground line adjacent to a first tip edge of the first power line;

providing a first tip edge of the first latch line adjacent to a first tip edge of the second latch line;

providing a first tip edge of the second ground line adjacent to a first tip edge of the second power line;

providing a second tip edge of the first power line opposing a first tip edge of the second bit line;

providing a second tip edge of the first latch line adjacent to a first side edge of the first word line;

providing a second tip edge of the second latch line adjacent to a first side edge of the second word line;

providing a first tip edge of the second word line adjacent to a first side edge of the second ground line;

providing a second tip edge of the second power line opposing a first tip edge of the first bit line;

forming the first ground line, first power line, and second bit line tip to tip along a first edge of the bit cell;

forming the first bit line, second power line, and second ground line tip to tip along a second edge of the bit cell opposite the first edge;

forming the first and second latch lines tip to tip between the first and second edges of the bit cell;

providing the first word line for sharing by the first bit cell and the second bit cell; and providing another second word line for sharing by the third bit cell and the fourth bit cell, wherein a second tip edge of the first word line is adjacent to a first tip edge of another second word line.

* * * * *